US00RE44929E

(19) United States
(12) Reissued Patent
Jacobs

(10) Patent Number: US RE44,929 E
(45) Date of Reissued Patent: Jun. 3, 2014

(54) VOLUME CONTROL FOR AUDIO SIGNALS

(75) Inventor: Stephen M. Jacobs, Cupertino, CA (US)

(73) Assignee: Dolby Laboratories Licensing Corporation, San Francisco, CA (US)

(21) Appl. No.: 13/341,873

(22) Filed: Dec. 30, 2011

Related U.S. Patent Documents

Reissue of:
(64) Patent No.: 7,251,337
Issued: Jul. 31, 2007
Appl. No.: 10/423,829
Filed: Apr. 24, 2003

U.S. Applications:
(63) Continuation of application No. 12/493,111, filed on Jun. 26, 2009, now Pat. No. Re. 43,132, which is an application for the reissue of Pat. No. 7,251,337.

(51) Int. Cl.
*H03G 3/00* (2006.01)

(52) U.S. Cl.
USPC ..... 381/107; 381/104; 381/27; 381/19; 381/22

(58) Field of Classification Search
USPC ..... 381/104–109, 27, 19, 22
See application file for complete search history.

(56) References Cited

U.S. PATENT DOCUMENTS

| | | | |
|---|---|---|---|
| 2,019,615 | A | 11/1935 | Maxfield |
| 3,772,479 | A | 11/1973 | Hilbert |
| 3,821,471 | A | 6/1974 | Bauer |
| 3,987,402 | A | 10/1976 | Smith |
| 4,024,344 | A | 5/1977 | Dolby et al. |
| 4,061,874 | A | 12/1977 | Fricke et al. |
| 4,577,305 | A | 3/1986 | Allen et al. |
| 4,589,129 | A | 5/1986 | Blackmer et al. |
| 5,113,447 | A | 5/1992 | Hatley et al. |

(Continued)

FOREIGN PATENT DOCUMENTS

| | | |
|---|---|---|
| DE | 198 18 217 | 10/1998 |
| EP | 1 253 805 | 10/2002 |

(Continued)

OTHER PUBLICATIONS

JP Office Action for foreign patent application No. 2006-510077, dated Aug. 27, 2009 (4 pages of English translation and original OA).

(Continued)

*Primary Examiner* — Disler Paul
(74) *Attorney, Agent, or Firm* — Hickman Palermo Truong Becker Bingham Wong LLP; Kirk D. Wong

(57) ABSTRACT

A motion picture soundtrack reproduction system has a center front soundtrack channel and a plurality of other soundtrack channels. A volume control adjusts the gain of all the channels. The volume control has a range of settings from a minimum to a maximum, the gain of the center front channel having substantially a first relationship to the volume control settings and the gain of the other channels having substantially a second relationship to the volume control settings, the relationships being such that for a range of volume control settings less than a first setting the gain of the center front channel remains substantially constant while the gain of the other channels decreases as the setting decreases or decreases more gradually than the gain of the other channels as the setting decreases.

27 Claims, 3 Drawing Sheets

(56) References Cited

U.S. PATENT DOCUMENTS

| | | | | |
|---|---|---|---|---|
| 5,128,999 | A | 7/1992 | Yanagawa | |
| 5,138,665 | A | 8/1992 | Ito | |
| 5,200,708 | A | 4/1993 | Morris, Jr. et al. | |
| 5,305,388 | A | 4/1994 | Konno | |
| 5,530,760 | A | 6/1996 | Paisley | |
| 6,026,168 | A | 2/2000 | Li et al. | |
| 6,148,085 | A | 11/2000 | Jung | |
| 6,311,155 | B1 | 10/2001 | Vaudrey et al. | |
| 6,351,733 | B1 | 2/2002 | Saunders et al. | |
| 6,442,278 | B1 | 8/2002 | Vaudrey et al. | |
| 6,498,855 | B1 | 12/2002 | Kokkosoulis et al. | |
| 6,501,717 | B1 | 12/2002 | Yamazaki | |
| 6,650,755 | B2 | 11/2003 | Vaudrey et al. | |
| 6,675,125 | B2 | 1/2004 | Bizjak et al. | |
| 6,778,966 | B2 | 8/2004 | Bizjak et al. | |
| 6,985,594 | B1 * | 1/2006 | Vaudrey et al. | 381/96 |
| 7,027,981 | B2 | 4/2006 | Bizjak et al. | |
| 7,110,550 | B2 * | 9/2006 | Motojima et al. | 381/27 |
| 7,190,292 | B2 | 3/2007 | Bizjak et al. | |
| 7,206,420 | B2 | 4/2007 | Bizjak et al. | |
| 7,212,640 | B2 | 5/2007 | Bizjak et al. | |
| 7,558,391 | B2 | 7/2009 | Bizjak et al. | |
| 2002/0013698 | A1 | 1/2002 | Vaudrey et al. | |
| 2002/0040295 | A1 | 4/2002 | Saunders et al. | |
| 2002/0076072 | A1 * | 6/2002 | Cornelisse | 381/312 |
| 2002/0172374 | A1 | 11/2002 | Bizjak et al. | |
| 2002/0172376 | A1 | 11/2002 | Bizjak et al. | |
| 2003/0002683 | A1 | 1/2003 | Vaudrey et al. | |
| 2003/0035549 | A1 | 2/2003 | Bizjak et al. | |
| 2004/0008851 | A1 | 1/2004 | Hagiwara | |

FOREIGN PATENT DOCUMENTS

| | | | |
|---|---|---|---|
| EP | 1254513 | A2 | 11/2002 |
| GB | 1 328 141 | | 8/1973 |
| GB | 2 031 638 | | 4/1980 |
| GB | 1253805 | | 10/2002 |
| JP | 59-177534 | | 10/1984 |
| JP | 59-186500 | A | 10/1984 |
| JP | 2907847 | | 7/1990 |
| JP | 2002-191099 | A | 7/2002 |
| JP | 2002-354600 | A | 12/2002 |
| WO | WO 99/26455 | | 5/1990 |
| WO | WO 99/26455 | | 5/1999 |
| WO | WO 2001039370 | A2 | 5/2001 |
| WO | WO 2001039370 | A3 | 5/2001 |

OTHER PUBLICATIONS

Ioan Allen, "Are Movies Too Loud?," SMPTE Film Conference, Mar. 22, 1997.

Dolby Laboratories, Inc., "Dolby Model 737 Soundtrack Loudness Meter" brochure, Copyright 1998.

Dolby Laboratories, Inc., "Dolby Model 737 Soundtrack Loudness Meter-Leq(m) Users' Manual Issue 3, Part No. 91533," Copyright 2000.

Press Release-Dolby Laboratories, Inc., "Dolby Announces New Effort to Banish TV Volume Problems at AES-2002," 112th AES Convention in Munich, May 10-13, 2002.

Dolby Laboratories, Inc., "LM 100 Broadcast Loudness Meter Preliminary Information" brochure, Copyright 2002.

Dolby Laboratories, Inc., "LM 100 Broadcast Loudness Meter," Copyright 2002.

Dolby Laboratories, Inc., "Preliminary Specification LM100 Broadcast Loudness Meter," Copyright 2002.

Dolby Laboratories, Inc., "Dolby Model 737 Soundtrack Loudness Meter," Copyright 2002.

Dolby Laboratories, Inc., "Dolby Model DP564 Multichannel Audio Decoder Users' Manual Issue I, Part No. 91830," Copyright 2002.

Bauer, Benjamin B., et al., "The Measurement of Loudness Level," Journal of the Acoustical Society of America, Aug. 1971, pp. 405-414.

Applicant's admitted prior art, p. 1, line 12-p. 4, line 11.*

Applicant's admitted prior art, p. 1, line 12-p. 4, line 11, Figure 1.*

* cited by examiner

VOLUME CONTROL FOR AUDIO SIGNALS

Matter enclosed in heavy brackets [ ] appears in the original patent but forms no part of this reissue specification; matter printed in italics indicates the additions made by reissue.

*CROSS-REFERENCE TO RELATED APPLICATIONS; BENEFIT CLAIM*

*More than one Reissue Application has been filed for the reissue of U.S. Pat. No. 7,251,337, issued Jul. 31, 2007. The reissue applications are application Ser. No. 12/493,111 filed Jun. 26, 2009, Ser. No. 13/341,871 filed Dec. 30, 2011 (copending application), Ser. No. 13/341,861 filed Dec. 30, 2011 (copending application), Ser. No. 13/341,870 filed Dec. 30, 2011 (copending application), and Ser. No. 13/341,873 filed Dec. 30, 2011 (the present application). The present application claims the benefit as a Reissue Continuation Application of Appln. Ser. No. 12/493,111, filed Jun. 26, 2009 (now U.S. Pat. No. Re. 43,132, issued on Jan. 24, 2012), which is a Reissue Application of U.S. Pat. No. 7,251,337, issued Jul. 31, 2007 (Appln. Ser. No. 10/423,829, filed Apr. 24, 2003), the entire contents of all of the foregoing are hereby incorporated by reference as if fully set forth herein, under 35 U.S.C. §120. Applicants hereby rescind any disclaimer of claim scope in the parent application(s) or the prosecution history thereof and advise the USPTO that the claims in this application may be broader than any claim in the parent application(s).*

TECHNICAL FIELD

The invention relates generally to the processing of audio signals. More particularly, the invention relates to control of the loudness of motion picture soundtracks when reproduced.

BACKGROUND ART

In the mid-1970s, Dolby Laboratories introduced a calibration recommendation for monitor levels in movie soundtracks ("Dolby" is a trademark of Dolby Laboratories, Inc.). A pink noise reference signal was used in the record chain to adjust the audio monitor level to 85 dBc. All theatres equipped for playback of the new stereo optical soundtracks were set up such that an equivalent pink noise signal in a soundtrack channel generated the same 85 dBc with the playback volume control (fader) set to the calibrated setting. This meant that theatres playing films at the calibrated volume control setting (a setting of "7" in a range of "0" to "10" on most cinema processors) reproduced the same loudness level selected by the film director and audio engineers in the dubbing theatre (referred to herein as "the mixer").

This system worked quite well for many years. Dolby Stereo (A-type encoded) films had limited headroom and the resulting constrained dynamic range yielded few audience complaints. Most theatres played films at the calibrated level. Soundtrack format technology has been significantly enhanced since Dolby Stereo. Dolby SR extended the headroom by 3 dB at midrange frequencies, and more at low and high frequencies. In recent years, the new digital formats have further increased the headroom. FIG. 1 shows maximum sound pressure level of one reproduced soundtrack channel versus frequency for four photographic soundtrack formats, Academy mono, Dolby A-type, Dolby SR and Dolby Digital. The curves are normalized with respect to their reference levels. Thus, they show the maximum sound pressure level that one channel of each different optical soundtrack system is capable of when playing a motion picture at the calibrated volume control setting in a properly set up theater. The maximum sound pressure level in a theater is also a function of the number of soundtrack channels. For example, five channels can deliver 2.5 times as much power as two channels, resulting in an increase of 4 dB in sound pressure level. Thus, in the case of five or seven channel digital soundtrack reproduction, for example, the increase in peak sound pressure level is even greater than that shown in FIG. 1.

Because the 85 dBc calibration technique has been maintained throughout evolving format changes, additional headroom is available on the newer soundtracks. However, feature films do have a consistent, subjective mix reference, independent of increased headroom, for dialogue record level, known as "associative loudness." When the dubbing mixer sees an actor on the screen, and there is no conflict between the dialogue and music or effects, the dialogue level in a moderate close-up is set to be plausible for the visual impression. Within reasonable limits, this generally holds true to within 2 or 3 dB. This natural dialogue level does not hold true for narration, as there is no corresponding visual reference. Music and effects have no direct visual associative loudness. Most people are not familiar with the actual sound pressure levels of a Concorde takeoff or a 50 mm howitzer. The music score level is equally uncalibrated.

As the headroom capability of the recording medium has been extended, it has certainly been used: the "non-associative" loudness of effects and music has risen to fill the available headroom space. Using dialogue as a reference, loud sounds like explosions are often 20 dB or more louder (explosions reach full scale peak level of 25 dB above dialogue level), and some quiet sounds, which are intended to be heard by all listeners, such as leaves rustling, may be 50 dB quieter.

In response to audience complaints that movies are too loud, many theatres are playing films substantially below the calibrated level. A volume control setting (fader level) of "6" or "5½," as opposed to the calibrated level (volume control standard setting) of "7," is not uncommon, representing a loudness reduction of approximately 4 or 6 dB. Some cinemas have their volume control permanently turned down to such settings because projectionists operating multiplexes with many screens showing different movies simultaneously don't have the time or cannot be bothered to set the controls differently for different movies. If the volume control is turned down to avoid complaints of excessive loudness, the dialogue is quieter than the mixer intended, and audiences may complain instead that some dialogue is not intelligible in the presence of other sounds in the film and/or general background noise of the theater (popcorn eating, air-conditioning, people talking, etc.). Theatre playback levels are often set by complaints generated by the loudest (and earliest) element of the show. If the playback level is set in response to the loudest trailer (preview), which is often louder than the feature film, the feature often plays at the same reduced level. The result is that the dialogue level of the feature is lowered by the same level deemed necessary to attenuate the trailer. A feature film played with a loudness 6 dB below the calibrated level may have serious dialogue intelligibility problems and very quiet sounds may become inaudible.

In addition, it is possible that the increased use of headroom from Dolby A-type to Dolby SR and digital releases has not been matched by a corresponding increase in power amplifier and loudspeaker capability. The resultant distortion from overloaded equipment may well exacerbate the loudness problems of recent soundtracks, causing increased incidence of complaints.

In early cinema sound equipment employing calibration, the volume control was a mechanical potentiometer, often with a click-stop or detent at the standard setting. More recent (digital) equipment uses a shaft encoder or a pair of up-down buttons (with a numeric display for the setting), delivering a control signal that operates on multipliers (either digital or voltage-controlled amplifiers) to affect the gain applied to all channels of the reproduced soundtracks. In typical cinema sound equipment, the volume control varies the gain gradually and relatively uniformly over a range of settings from about "4" to "10," with the gain falling more rapidly at setting below about "4," allowing a fade to inaudibility. Such a typical prior art relationship between gain or loss and volume control setting is shown in the lower curve of FIG. 2, described below.

With the exception of monophonic installations, to which the present invention does not apply, all movie sound installations include three or more front loudspeakers including a center front. Historically, film mixers place dialogue in the center front channel and it is rare for speech from an on-screen actor to be placed anywhere else. This applies both for a multitrack digital soundtrack (for instance 5.1- or 7.1-channels) or a two-channel analog optical soundtrack reproduced via a matrix decoder to derive left, center, right and surround outputs. The center front channel may of course contain other material, but, generally, it is material important in following the action of the movie because the audience's attention is focused on the screen. At moments when the soundtrack is loud enough to provoke complaint, several channels are generally contributing to that loudness, not just any one, and in particular not just the center front.

DISCLOSURE OF INVENTION

In accordance with the present invention, a motion picture soundtrack reproduction system comprises a center front soundtrack channel and a plurality of other soundtrack channels. A volume control adjusts the gain of all the channels, the volume control having a range of settings from a minimum to a maximum, the gain of the center front channel having substantially a first relationship to the volume control settings and the gain of the other channels having substantially a second relationship to the volume control settings, the relationships being such that for a range of volume control settings less than a first setting the gain of the center front channel remains substantially constant while the gain of the other channels decreases as the setting decreases or decreases more gradually than the gain of the other channels as the setting decreases.

Also in accordance with the present invention, a motion picture soundtrack reproduction system comprises a center front soundtrack channel and a plurality of other soundtrack channels, each of the channels having adjustable gain and one or more loudspeakers, and a controller having a volume control for adjusting the gain of all the channels, the volume control having a range of settings from a minimum to a maximum, the gain of the center front channel having a first relationship to the volume control settings and the gain of the other channels having a second relationship to the volume control settings, the relationships being such that for a range of volume control settings less than a first setting the gain of the center front channel remains substantially constant while the gain of the other channels decreases as the setting decreases or decreases more gradually than the gain of the other channels as the setting decreases.

The range of volume control settings less than the first setting extends down to the minimum control setting or, alternatively, down to a second setting above the minimum control setting. In the latter case, for settings less than the second setting the gains of all the channels decrease in substantially the same way as the setting decreases and for such volume control settings the gain of the center front channel is greater than the gain of the other channels. Optionally, for settings less than the second setting the gain of the center front channel is greater than the gain of the other channels by a substantially constant amount in the logarithmic domain.

For settings greater than the first setting the gains of all the channels may increase as the setting increases and for each of such volume control settings the gain of the center front channel and the gain of the other channels may be substantially the same.

The invention is particularly advantageous in an arrangement in which when the volume control is set to a standard setting, each of the channels has a respective gain that produces a respective standard acoustic level in response to a signal having a respective standard reference level in the channel. In that case, the first setting is about the standard setting.

The invention provides for reducing the maximum loudness, and thereby avoiding complaints, while maintaining the acoustic level of the center front containing dialogue and requiring only one user-operated control. According to an embodiment of the invention, the cinema equipment is designed and installed in the conventional manner to the extent that with the volume control nominally at its standard setting, each of the reproduced soundtrack channels has a respective gain that produces a respective standard acoustic level in response to a signal having a respective standard reference level in the channel, thus matching the standard levels in a film mixing room. Thus, when calibrated, the playback system with its volume control at the standard setting has an apparent loudness that is substantially the same as that intended by the film mixer. However, in accordance with the present invention, if the volume control is turned down below the standard setting in response to actual (or expected) complaints from the audience, over a limited range of settings all channels except the center front are attenuated equally, but the center front is reduced by a smaller degree (or not at all). The effect is not only a reduction in the overall loudness but an increase in the proportionate contribution of the center front channel, with a potential improvement in intelligibility when the other channels are loud. Optionally, after some degree of changing the balance of the center front to other channels down to a setting below the standard setting, for further lowering of the settings all channels are attenuated equally, maintaining fixed the altered balance.

BEST MODE FOR CARRYING OUT THE INVENTION

Figure 1:
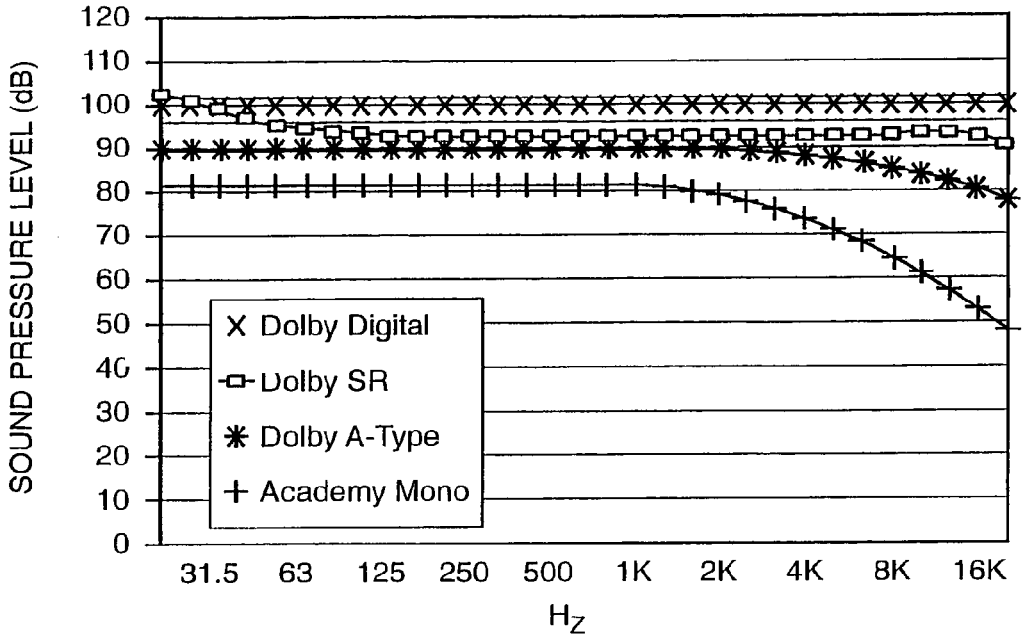
FIG. 1 shows maximum sound pressure level versus frequency for four photographic soundtrack formats, Academy mono, Dolby A-type, Dolby SR and Dolby Digital.
Figure 2:
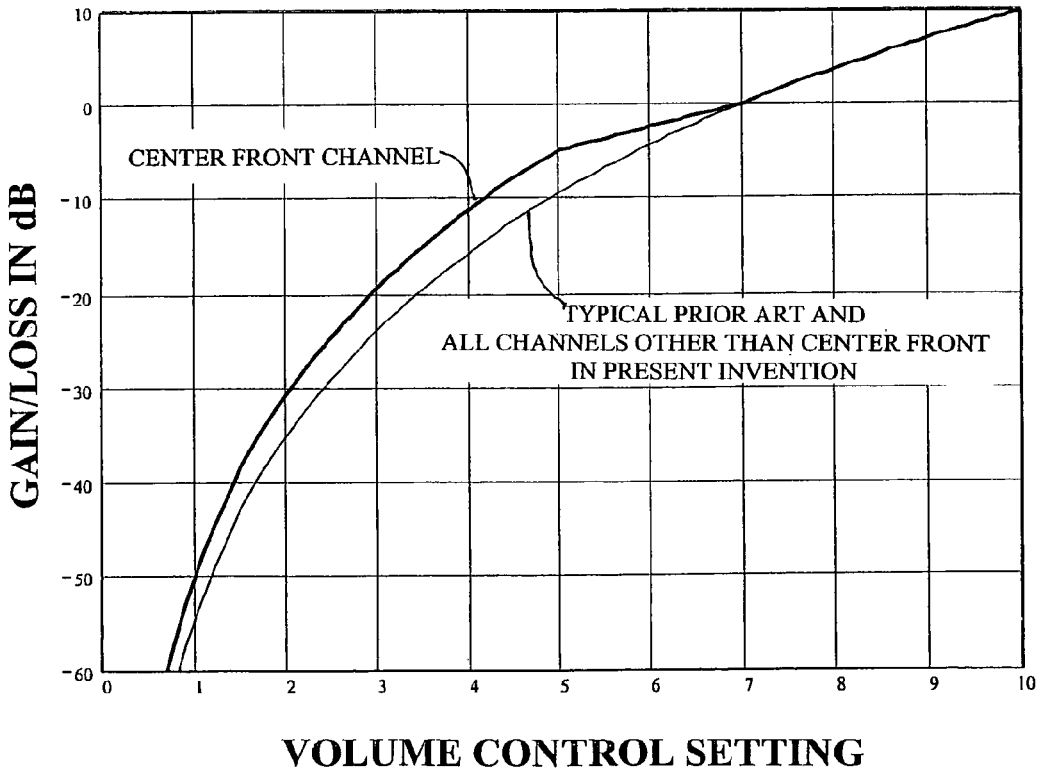
FIG. 2 shows one set of suitable relationships between gain of the center front soundtrack channel and gain of each of the other soundtrack channels versus volume control setting, in which a gain of 0 dB is obtained for the standard volume control setting.

FIG. 2 illustrates idealized curves of gain/loss as a function of volume control setting, for the center front channel (upper line) and for each of the remaining channels (lower line). The lower line also shows the typical gain/loss for all channels (rather than channels other than the center front channel, as in the present invention) as a function of volume control setting in prior art motion picture sound equipment. While the characteristic responses shown in the example of FIG. 2 are practical and useful ones, the precise characteristics are not critical. For example, the lower characteristic curve need not be the same as in the prior art gain/loss for all channels versus volume control setting The characteristics shown in the figures are just one example of suitable characteristics that fall within the scope of the invention Still referring to FIG. 2, it will be seen that the gain of the center front channel has a first relationship to the volume control settings and that the gain of each of the other channels has a second relationship to the volume control settings. In FIG. 2, 0 dB is defined as the gain with the volume control at a first setting, the standard "7" setting. As shown in FIG. 2, for settings less than the first setting down to a second setting, the gain of the center front channel decreases more gradually than the gain of the other channels as the setting decreases. Alternatively, over a limited range of settings just below the standard setting, for instance between a setting of "7" and a setting of "6," the center channel gain may be constant as the gain of the other channels changes. Although such changes in gain (either alternative) may extend down to the minimum volume control setting, in a practical embodiment such changes in gain preferably do not extend down to the minimum setting but rather to a second setting, which may be a setting of about "5," for example, as shown in FIG. 2. In that case, for settings below the second setting, the gains of all the channels decrease in substantially the same way as the setting decreases and for such volume control settings the gain of the center front channel is greater than the gain of the other channels by a few dB, for example, as shown in FIG. 2. Preferably, for settings above the nominal standard setting up to a maximum setting, the gains of all the channels increase as the setting increases and for each of such volume control settings the gain of the center front channel and the gain of the other channels are substantially the same. It should be understood that the relationships between the gain of the center front channel, on one hand, and the gain of the other channels, on the other hand, versus the volume control settings need not be precisely in accordance with the examples of FIG. 2, but are to be limited only by the scope of the appended claims.

Figure 3:
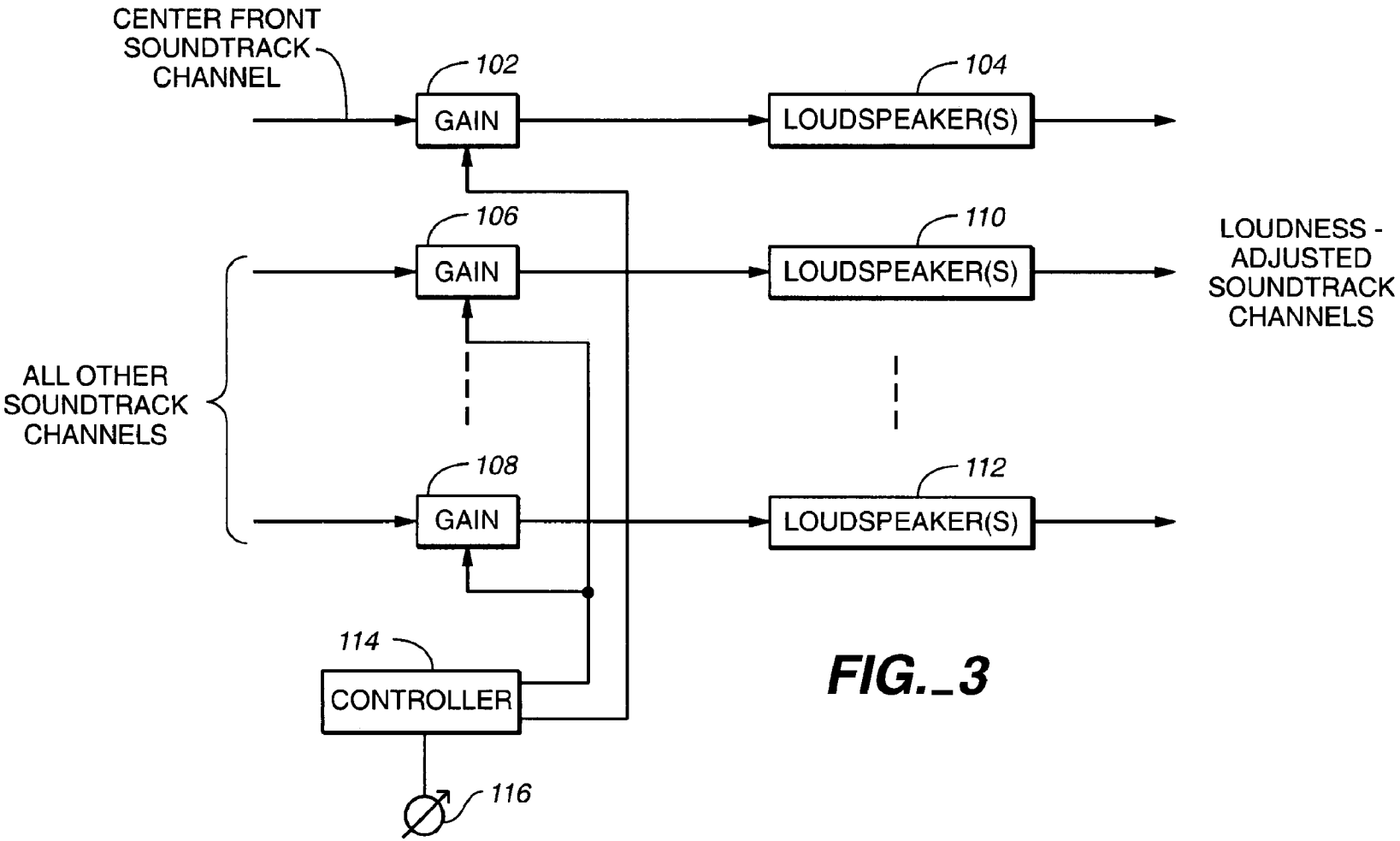
FIG. 3 is a simplified block diagram showing an implementation of the present invention from a structural standpoint.

An exemplary system according to the present invention is shown in FIG. 3. A center front soundtrack channel has a gain adjuster 102 that controls the gain of the channel. The channel feeds one or more loudspeakers 104 via a power amplifier (not shown). In practice, the gain adjuster 102 may be, for example, the gain or volume control of a preamplifier or a passive variable loss at the output (preferably the output rather than the input) of a preamplifier. A plurality of other channels, shown for simplicity as two channels, each has a respective gain adjuster 106 and 108. Each channel feeds one or more respective loudspeakers 110 and 112 via respective power amplifiers (not shown). The gain adjuster 102 for the center front channel is controlled by a first output of a controller 114 and the gain adjusters 106 and 108 for the other channels are controlled by a second output of controller 114, in the manner described herein in response to the setting of the controller's volume control 116.

Figure 4:
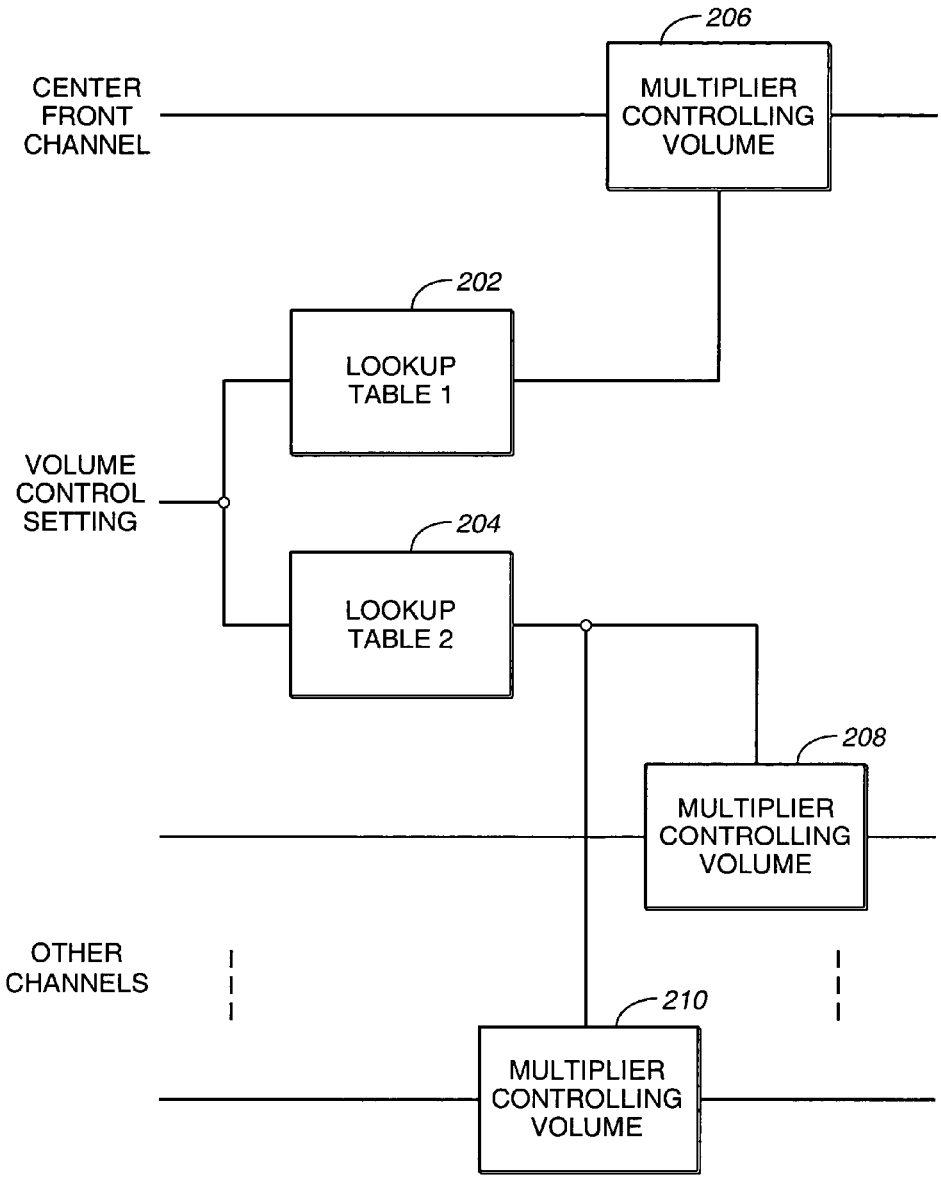
FIG. 4 is a simplified block diagram showing an implementation of the present invention from a functional standpoint.

In a practical arrangement employing digital controls, as shown in FIG. 4, the volume control setting may select values in first and second lookup tables 202 and 204. The first lookup table 202 in turn may adjust a multiplier controlling volume 206 in the center front channel, while the second lookup table 204 may adjust multipliers controlling volume 208 and 210 in the other channels. Lookup table values in response to volume control settings may be chosen so as to provide the desired relationships between gains in the various channels versus setting.

The present invention and its various aspects may be implemented in analog circuitry, for example, with two suitable non-linear functions relating control setting to gain, or as software functions performed in digital signal processors, programmed general-purpose digital computers, and/or special purpose digital computers, or some combination of such devices and functions. Interfaces between analog and digital signal streams may be performed in appropriate hardware and/or as functions in software and/or firmware.

The invention claimed is:

[1. A motion picture soundtrack reproduction system, the system having a center front soundtrack channel and a plurality of other soundtrack channels, comprising a controller having a volume control for adjusting the gain of all the channels, the volume control having a range of settings from a minimum to a maximum, the controller having a first output for controlling the gain of the center front channel and a second output for controlling the gain of the other channels in response to settings of the volume control, the gain of the center front channel having a first relationship to the volume control settings and the gain of the other channels having a second relationship to the volume control settings, the relationships being such that for a range of volume control settings less than a first setting the gain of the center front channel (1) remains substantially constant while the gain of the other channels decreases as the setting decreases, or (2) decreases more gradually than the gain of the other channels as the setting decreases.]

[2. A motion picture soundtrack reproduction system, comprising a center front soundtrack channel and a plurality of other soundtrack channels, each of said channels having adjustable gain and one or more loudspeakers, and a controller having a volume control for adjusting the gain of all the channels, the volume control having a range of settings from a minimum to a maximum, the controller having a first output for controlling the gain of the center front channel and a second output for controlling the gain of the other channels in response to settings of the volume control the gain of the center front channel having a first relationship to the volume control settings and the gain of the other channels having a second relationship to the volume control settings, the relationships being such that for a range of volume control settings less than a first setting the gain of the center front channel (1) remains substantially constant while the gain of the other channels decreases as the setting decreases or (2) decreases more gradually than the gain of the other channels as the setting decreases.]

[3. A system according to claim 1 or claim 2 wherein the range of volume control settings less than said first setting extends down to the minimum control setting.]

[4. A system according to claim 1 or claim 2 wherein the range of volume control settings less than said first setting extends down to a second setting above the minimum control setting.]

[5. A system according to claim 3 wherein for settings less than said second setting the gains of all the channels decrease in substantially the same way as the setting decreases and for such volume control settings the gain of the center front channel is greater than the gain of the other channels.]

[6. A system according to claim 5 wherein for settings less than said second setting the gain of the center front channel is greater than the gain of the other channels by a substantially constant amount in the logarithmic domain.]

[7. A system according to claims 1 wherein for settings greater than said first setting the gains of all the channels increase as the setting increases and for each of such volume control settings the gain of the center front channel and the gain of the other channels are substantially the same.]

[8. A system according to claims 1 wherein when the volume control is set to a standard setting, each of the channels has a respective gain that produces a respective standard acoustic level in response to a signal having a respective standard reference level in the channel.]

[9. A system according to claim 8 wherein said first setting is about said standard setting.]

*10. A method, comprising:*

*processing an audio signal by adjusting a gain of a first channel of the audio signal and a gain of a second channel of the audio signal with respect to a control feature setting, the gain of the first channel is adjusted at a first relationship to the gain of the second channel as settings of the control feature are above a first threshold level and the gain of the first channel is adjusted at a second relationship to the gain of the second channel as settings of the control feature are below a second threshold level, the first relationship different from the second relationship;*

*wherein the method is performed by one or more computing devices.*

*11. The method of claim 10, wherein the adjusting employs digital controls.*

*12. The method of claim 11, wherein the digital controls use a first lookup table to adjust the gain of the first channel and a second lookup table to adjust the gain of the second channel.*

*13. The method of claim 10, wherein the control feature is a volume control.*

*14. The method of claim 10, wherein the second channel is at least one of a left channel, right channel, and surround channel.*

*15. The method of claim 10, wherein the audio signal is in a Dolby Digital format.*

*16. The method of claim 10, wherein the audio signal is a digital audio signal.*

*17. The method of claim 10, wherein first channel is a center channel.*

*18. The method of claim 10, wherein the audio signal is a multitrack digital soundtrack.*

*19. An apparatus, comprising:*

*a subsystem, implemented at least partially in hardware that processes an audio signal by adjusting a gain of a first channel of the audio signal and a gain of a second channel of the audio signal with respect to a control feature setting, the gain of the first channel is adjusted at a first relationship to the gain of the second channel as settings of the control feature are above a first threshold level and the gain of the first channel is adjusted at a second relationship to the gain of the second channel as settings of the control feature are below a second threshold level, the first relationship different from the second relationship.*

*20. The apparatus of claim 19, wherein the processing subsystem employs digital controls.*

*21. The apparatus of claim 20, wherein the digital controls use a first lookup table to adjust the gain of the first channel and a second lookup table to adjust the gain of the second channel.*

*22. The apparatus of claim 19, wherein the control feature is a volume control.*

*23. The apparatus of claim 19, wherein the second channel is at least one of a left channel, right channel, and surround channel.*

*24. The apparatus of claim 19, wherein the audio signal is in a Dolby Digital format.*

*25. The apparatus of claim 19, wherein the audio signal is a digital audio signal.*

*26. The apparatus of claim 19, wherein first channel is a center channel.*

*27. The apparatus of claim 19, wherein the audio signal is a multitrack digital soundtrack.*

*28. A non-transitory computer readable medium, storing software instructions, which when executed by one or more processors cause performance of the steps of:*

*processing an audio signal by adjusting a gain of a first channel of the audio signal and a gain of a second channel of the audio signal with respect to a control feature setting, the gain of the first channel is adjusted at a first relationship to the gain of the second channel as settings of the control feature are above a first threshold level and the gain of the first channel is adjusted at a second relationship to the gain of the second channel as settings of the control feature are below a second threshold level, the first relationship different from the second relationship.*

*29. The non-transitory computer readable medium of claim 28, wherein the adjusting employs digital controls.*

*30. The non-transitory computer readable medium of claim 29, wherein the digital controls use a first lookup table to adjust the gain of the first channel and a second lookup table to adjust the gain of the second channel.*

*31. The non-transitory computer readable medium of claim 28, wherein the control feature is a volume control.*

*32. The non-transitory computer readable medium of claim 28, wherein the second channel is at least one of a left channel, right channel, and surround channel.*

*33. The non-transitory computer readable medium of claim 28, wherein the audio signal is in a Dolby Digital format.*

*34. The non-transitory computer readable medium of claim 28, wherein the audio signal is a digital audio signal.*

*35. The non-transitory computer readable medium of claim 28, wherein first channel is a center channel.*

*36. The non-transitory computer readable medium of claim 28, wherein the audio signal is a multitrack digital soundtrack.*

* * * * *